(12) United States Patent
Song et al.

(10) Patent No.: US 7,855,933 B2
(45) Date of Patent: Dec. 21, 2010

(54) CLOCK SYNCHRONIZATION CIRCUIT AND OPERATION METHOD THEREOF

(75) Inventors: Taek-Sang Song, Gyeonggi-do (KR);
Kyung-Hoon Kim, Gyeonggi-do (KR);
Dae-Han Kwon, Gyeonggi-do (KR);
Dae-Kun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 266 days.

(21) Appl. No.: 12/165,045

(22) Filed: Jun. 30, 2008

(65) Prior Publication Data

US 2009/0175116 A1 Jul. 9, 2009

(30) Foreign Application Priority Data

Jan. 8, 2008 (KR) .................. 10-2008 0002042
Apr. 1, 2008 (KR) .................. 10-2008-0030293

(51) Int. Cl.
*G11C 8/00* (2006.01)

(52) U.S. Cl. .................. 365/233.1; 365/189.04; 365/194; 365/189.12

(58) Field of Classification Search .......... 365/233.1, 365/189.04, 194, 189.11, 189.12, 192
See application file for complete search history.

(56) References Cited

U.S. PATENT DOCUMENTS 6,924,705 B2 * 8/2005 Huang .................. 331/10
2009/0322389 A1 * 12/2009 Singh et al. .............. 327/158
2010/0099367 A1 * 4/2010 Shamim et al. ............ 455/95

FOREIGN PATENT DOCUMENTS

| JP | 2000-232356 | 8/2000 |
| JP | 2000-349626 | 12/2000 |
| KR | 1020050103367 A | 10/2005 |
| KR | 1020060032410 A | 4/2006 |
| KR | 1020070035923 A | 4/2007 |
| KR | 1020080014440 A | 2/2008 |
| KR | 1020080024032 A | 3/2008 |
| KR | 1020080024892 A | 3/2008 |

OTHER PUBLICATIONS

Notice of Preliminary Rejection issued from Korean Intellectual Property Office on Apr. 8, 2009 with an English Translation.
Notice of Allowance issued from Korean Intellectual Property Office on Jun. 15, 2009 with an English Translation.
Notice of Allowance issued from Korean Intellectual Property Office on Nov. 3, 2009.

* cited by examiner

*Primary Examiner*—Pho M Luu
*Assistant Examiner*—Han Yang
(74) *Attorney, Agent, or Firm*—IP & T Group LLP

(57) ABSTRACT

A semiconductor memory device with a clock synchronization circuit capable of performing a desired phase/frequency locking operation, without the jitter peaking phenomenon and the pattern jitter of an oscillation control voltage signal using injection locking. The device includes a phase-locked loop that detects a phase/frequency difference between a feedback clock signal and a reference clock signal to generate an oscillation control voltage signal corresponding to the detected phase/frequency difference, and generates the feedback clock signal corresponding to the oscillation control voltage signal. An injection locking oscillation unit sets up a free running frequency in response to the oscillation control voltage signal and generates an internal clock signal which is synchronized with the reference clock signal.

30 Claims, 12 Drawing Sheets

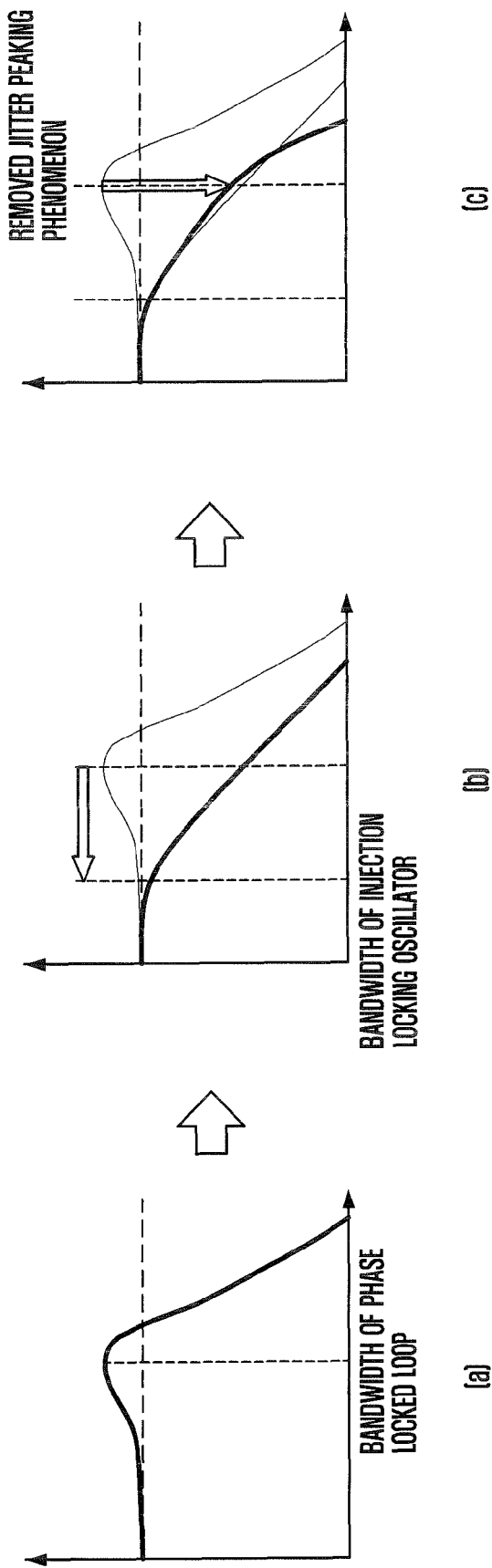

CLOCK SYNCHRONIZATION CIRCUIT AND OPERATION METHOD THEREOF

CROSS-REFERENCE TO RELATED APPLICATIONS

The present invention claims priority of Korean patent application numbers 10-2008-0002042 and 10-2008-0030293, filed on Jan. 8, 2008 and Apr. 1, 2008, respectively, which are incorporated by reference in their entirety.

BACKGROUND OF THE INVENTION

The present invention relates to a semiconductor design technology and, more particularly to a clock synchronization circuit and a method for operating the same.

Generally, in a semiconductor memory device including a DDR SDRAM (Double Data Rate Synchronous DRAM), internal clock signals are produced using an external clock signal and these internal clock signals are used as reference clock signals for synchronization with various operation timing. Accordingly, a clock synchronization circuit for synchronizing the external clock signal and the internal clock signals is provided in the semiconductor memory device. A typical clock synchronization circuit is a phase-locked loop (PLL).

When the internal clock signals are produced by the phase-locked loop, a voltage controlled oscillator (VCO) is required and this voltage controlled oscillator can be classified into an analog-based operating oscillator and a digital-based operating oscillator.

FIG. 1 is a block diagram illustrating a conventional analog PLL. As shown in FIG. 1, the analog PLL includes a phase/frequency detector 110, a charge pumping device 130, a control voltage signal generator 150 and a voltage controlled oscillator (VCO) 170.

The phase/frequency detector 110 produces an up-detection signal DET_UP and a down-detection signal DET_DN which correspond to a phase/frequency difference between a reference clock signal CLK_REF and a feedback clock signal CLK_FED. The reference clock signal CLK_REF corresponds to the external clock signal and the up-detection signal DET_UP and the down-detection signal DET_DN are pulse signals which are activated according to the phase/frequency relationship between the reference clock signal CLK_REF and the feedback clock signal CLK_FED. These pulse signals will be described in relation to the corresponding operations.

The charge pumping device 130 performs positive charge pumping in response to the up-detection signal DET_UP, and negative charge pumping in response to the down-detection signal DET_DN. That is, the charge pumping device 130 supplies charge to the control voltage signal generator 150 in response to the up-detection signal DET_UP and discharges the control voltage signal generator 150 in response to the down-detection signal DET_DN.

The control voltage signal generator 150 produces an oscillation control voltage signal V_CTR through a charge operation based on the positive charge pumping operation of the charge pumping device 130, and produces the oscillation control voltage signal V_CTR through a discharge operation based the negative charge pumping operation of the charge pumping device 130. In other words, the voltage level of the oscillation control voltage signal V_CTR is dependent upon the charge and discharge operation of the charge pumping device 130. The control voltage signal generator 150 is represented having a resistance R and a capacitance C in series with a supply voltage VSS.

The voltage controlled oscillator 170 produces a PLL clock signal CLK_PLL having a frequency which corresponds to the oscillation control voltage signal V_CTR. The voltage controlled oscillator 170 may be designed to include a plurality of delay cells (not shown) as an oscillator, which feeds back differential input signals delayed by a delay time corresponding to the oscillation control voltage signal V_CTR. The generated PLL clock signal CLK_PLL becomes the feedback clock signal CLK_FED, which is inputted to the phase/frequency detector 110, and the phase/frequency detector 110 repeatedly produces the up-detection signal DET_UP and the down-detection signal DET_DN which correspond to a phase/frequency difference between the reference clock signal CLK_REF and the feedback clock signal CLK_FED.

The phase/frequency detector 110, the charge pumping device 130, the control voltage signal generator 150 and the voltage controlled oscillator 170 form the phase-locked loop circuit, are well known to those skilled in the art, so that their detailed description will be omitted.

The operation of the phase-locked loop will be described briefly below.

The phase/frequency detector 110 produces the up-detection signal DET_UP and the down-detection signal DET_DN by detecting the phase/frequency difference between the reference clock signal CLK_REF and the feedback clock signal CLK_FED. The up-detection signal DET_UP is a pulse signal having a pulse width corresponding to the phase difference when the phase of the feedback clock signal CLK_FED lags behind that of the reference clock signal CLK_REF. The down-detection signal DET_DN is a pulse signal having a pulse width corresponding to the phase difference when the phase of the feedback clock signal CLK_FED leads that of the reference clock signal CLK_REF.

The charge pumping device 130 charges or discharges the control voltage signal generator 150 through a charge pumping operation, which is conducted by the up-detection signal DET_UP and the down-detection signal DET_DNP. Through the charging or discharging operation, the voltage level of the oscillation control voltage signal V_CTR generated by the control voltage signal generator 150 is varied. In other words, the voltage level of the oscillation control voltage signal V_CTR is raised in response to the up-detection signal DET_UP and lowered in response to the down-detection signal DET_DN.

The voltage controlled oscillator 170 produces the PLL clock signal CLK_PLL of low frequency according to the oscillation control voltage signal V_CTR of a high voltage level and also produces the PLL clock signal CLK_PLL of high frequency according to the oscillation control voltage signal V_CTR of a low voltage level. The relationship between the oscillation control voltage signal V_CTR and the PLL clock signal CLK_PLL can be changed by a design architecture. That is, it is possible to produce the PLL clock signal CLK_PLL of a low frequency according to the oscillation control voltage signal V_CTR of a low voltage level or produce the PLL clock signal CLK_PLL of high frequency according to the oscillation control voltage signal V_CTR of a high voltage level.

The feedback signal CLK_FED is the PLL clock signal CLK_PLL which is fed back to the phase/frequency detector 110. The phase/frequency detector 110 detects again a phase/frequency difference between the frequency-changed feedback clock signal CLK_FED and the reference clock signal CLK_REF.

Through these repeated detections, the phase-locked loop outputs the PLL clock signal CLK_PLL which is synchronized with the reference clock signal CLK_REF. The synchronization between the reference clock signal CLK_REF and the PLL clock signal CLK_PLL is called "phase/frequency locking."

Meanwhile, recently, in order to increase the operation speed of the semiconductor device, the frequency of the external clock signal has repeatedly increased, up to as high as a few GHz. Jitter, which is mixed with the external clock signal and inputted to the internal circuit, cannot be disregarded in high frequency operation. Accordingly, the phase-locked loop is designed to output the PLL clock signal CLK_PLL with low jitter by improving filtering as well as by improving phase/frequency locking.

FIG. 2 is a graph showing characteristics of a jitter transfer function of the phase-locked loop of FIG. 1.

Referring to FIG. 2, the dotted line "A" shows a jitter transfer function of an ideal low pass filter, and the solid line "B" shows a jitter transfer function of a conventional low pass filter. In the phase-locked loop, the high frequency jitter component is filtered away by the low pass filter so that any high frequency jitter component is not shown in the PLL clock signal CLK_PLL to be outputted from the voltage controlled oscillator 170. However, as shown in the graph, the jitter is further amplified in the range of the bandwidth. This jitter peaking phenomenon seriously worsens the jitter of the PLL clock signal CLK_PLL by amplifying jitter caused by power noise as well as the input jitter.

The reason that the jitter peaking phenomenon is caused is that the phase-locked loop, which is a closed-loop system having two poles in the frequency domain (s-domain), does not secure a desired phase margin in the phase/frequency locking process.

Here, the pole is a value which makes a denominator of a transfer function "0". "Zero" is an opposite concept of the pole to make a numerator of the transfer function "0". "Zero" and "pole" are factors to determine the phase margin and are indexes to measure the stability or instability of the system.

If the phase margin is 60° in a system, the time for a signal oscillating in a time-domain to come back to a steady state can be minimized. For example, the response time may be fast when the phase margin of such a system is smaller than 60°; however, it will take the signal a lot of time to come back to the steady state because of the high instability of the signal. On the contrary, if the phase margin of the system is larger than 60°, the stability can be improved; however, the response time is slow so that it will take the signal a lot of time to come back to the steady state.

On the other hand, the phase-locked loop makes it possible to take a desired phase margin by obtaining a "zero" through control of the resistance and capacitance in the control voltage signal generator 150. However, for the following reasons it is still difficult to design a phase-locked loop which has a desired phase margin.

First, as mentioned above, a typical phase-locked loop is a closed-loop system having two poles. Therefore, since the phase margin is small and the jitter peaking phenomenon occurs, the signal jitter included in the signal is amplified and the power noise also largely amplifies the jitter. As a result, the PLL clock signal CLK_PLL deteriorates seriously.

To overcome this problem, the phase margin of the phase-locked loop can be widened by having a large resistance value of the resistor R (creating a "zero"). However, there is another problem in that the pattern jitter, which is periodically generated, is increased because of the ripple of the oscillation control voltage signal V_CTR.

That is, in the phase-locked loop, there is a problem that the pattern jitter of the oscillation control voltage signal V_CTR is largely caused when the resistance value of the resistor R is increased to remove the jitter peaking phenomenon, and there is another problem that the jitter peaking phenomenon is also caused when the resistance value of the resistor R is decreased to remove the pattern jitter. In other words, there is a trade-off relationship between the jitter peaking phenomenon and the pattern jitter of the oscillation control voltage signal V_CTR.

As mentioned above, the phase-locked loop is designed to output the PLL clock signal CLK_PLL with low jitter by filtering the jitter component. However, a preferred filtering operation cannot be achieved because of the jitter peaking phenomenon in the jitter transfer function of the phase-locked loop. Further, if the resistance value of the resistor R is adjusted in order to remove the jitter peaking phenomenon, the pattern jitter of the oscillation control voltage signal V_CTR is increased so that an exact phase/frequency locking operation cannot be achieved.

SUMMARY OF THE INVENTION

The present invention provides a clock synchronization circuit capable of performing a desired phase/frequency locking operation, without the jitter peaking phenomenon and the pattern jitter of an oscillation control voltage signal, by using an injection locking method.

In accordance with an aspect of the invention, a semiconductor memory device includes a phase-locked loop configured to detect a phase/frequency difference between a feedback clock signal and a reference clock signal to generate an oscillation control voltage signal corresponding to the detected phase/frequency difference, and generate the feedback clock signal corresponding to the oscillation control voltage, and an injection locking oscillation unit configured to set up a free running frequency in response to the oscillation control voltage signal and generate an internal clock signal which is synchronized with the reference clock signal.

In accordance with another aspect of the invention, a clock synchronization circuit includes a phase/frequency detecting unit configured to detect a phase/frequency difference between a reference clock signal and a feedback clock signal and output a detection signal, a charge pumping unit configured to perform a charge pumping operation in response to the detection signal, a control voltage generating unit configured to generate an oscillation control voltage signal according to the charge pumping operation, a voltage controlled oscillator configured to generate the feedback clock signal according to the oscillation control voltage signal, and an injection locking oscillator configured to set up a free running frequency in response to the oscillation control voltage signal and generate an internal clock signal in synchronization with the reference clock signal.

In accordance with a further aspect of the invention, a method for driving a clock synchronization circuit includes performing a phase/frequency locking operation between a reference clock signal and a feedback clock signal to generate an oscillation control voltage signal, and setting up a free running frequency in response to the oscillation control voltage signal and performing an injection clocking operation to generate an internal clock signal in synchronization with the reference clock signal.

In accordance with still another aspect of the invention, a clock synchronization circuit includes a phase/frequency detecting unit configured to detect a phase/frequency difference between a reference clock signal and a feedback clock signal and output a detection signal, a charge pumping unit configured to perform a charge pumping operation in response to the detection signal, a control voltage generating unit configured to generate an oscillation control voltage signal according to the charge pumping operation, a voltage controlled oscillator configured to generate internal source clock signals with a frequency corresponding to the oscillation control voltage signal, a dividing unit configured to divide the internal source clock signals to output the feedback clock, and an injection locking oscillator configured to set up a free running frequency in response to the oscillation control voltage signal and generate an internal clock signal in response to the internal source clock signals.

A jitter component included in an external clock signal cannot be disregarded as the frequency of the external clock signal becomes higher and higher. Accordingly, a phase-locked loop for a phase/frequency locking operation is designed to output a PLL clock signal of low jitter by filtering the jitter component. However, it is difficult to solve the problems of the jitter peaking phenomenon of the phase-locked loop and the pattern jitter of the voltage controlled signal. The invention solves these problems by providing an injection locking oscillator to a typical phase-locked loop. The phase-locked loop is not provided for an internal clock signal, but for an oscillation control voltage signal to set up a free running frequency of the injection locking oscillator. The injection locking oscillator performs injection locking based on the free running frequency which is set up by the oscillation control voltage signal and produces the internal clock signals in synchronization with a reference clock signal. That is, the phase/frequency locking is carried out through the injection locking operation.

Since the clock synchronization circuit according to the invention operates based on an open-loop system, the jitter peaking phenomenon does not occur. Also, since a filtered control voltage is used, no pattern jitter of the oscillation control voltage signal occurs in generating the internal clock signals. Meanwhile, the clock synchronization circuit according to the invention can improve the operating characteristics of the jitter with a stable phase/frequency locking operation as well as power consumption.

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 12 is graph showing the characteristics of the transfer function of the clock synchronization circuit of FIG. 9;

DETAILED DESCRIPTION OF THE PREFERRED EMBODIMENTS

Hereinafter, the present invention will be described in detail with reference to several embodiments. The embodiments merely exemplify the invention, and the scope of invention rights to be protected is not limited thereby.

Figure 3:
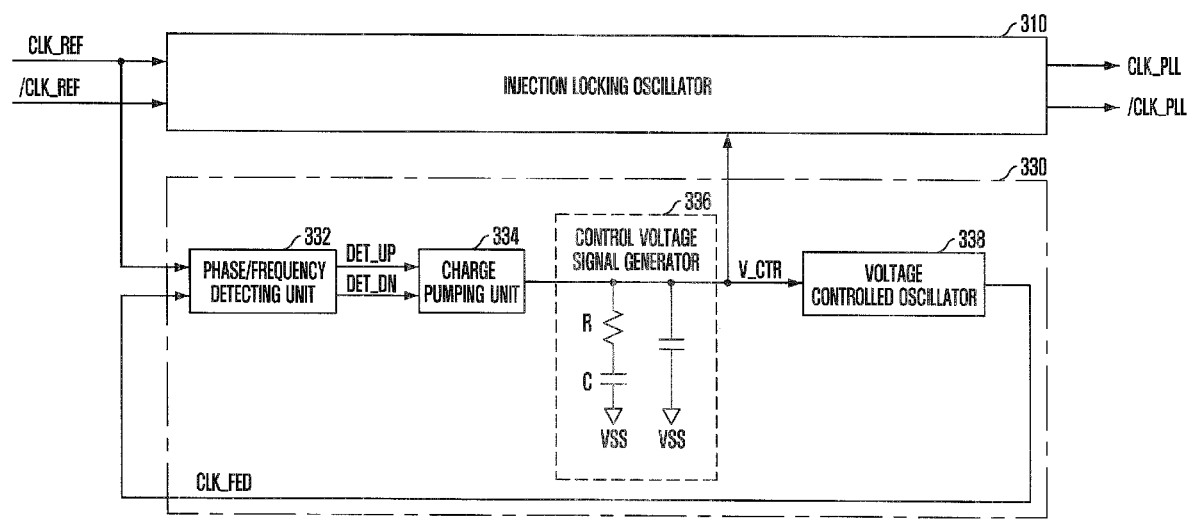
FIG. 3 is a block diagram illustrating a clock synchronization circuit according to the present invention.

FIG. 3 is a block diagram illustrating a clock synchronization circuit according to the invention. Referring to FIG. 3, the clock synchronization circuit includes an injection locking oscillator 310 and a phase-locked loop 330.

In the injection locking oscillator 310, a free running frequency is set up in response to an oscillation control voltage signal V_CTR which is generated by the phase-locked loop 330, and PLL clock signals CLK_PLL and /CLK_PLL are generated in synchronization with reference clock signals CLK_REF and /CLK_REF. The detailed circuit and operation are described below. For reference, the reference clock signals CLK_REF and /CLK_REF correspond to an external clock signal. The positive reference clock signal CLK_REF is generated in synchronization with a rising edge of the external clock signal and the negative reference clock signal /CLK_REF is generated in synchronization with a falling edge of the external clock signal.

The phase-locked loop 330 includes a phase/frequency detecting unit 332, a charge pumping unit 334, a control voltage signal generating unit 336 and a voltage controlled oscillator (VCO) 338. These functional blocks of the phase-locked loop 330 are well known to those skilled in the art. Accordingly, the operations of these blocks will be illustrated briefly, but the detailed circuit and operation will be omitted for the sake of brevity.

First, the phase/frequency detecting unit 332 produces an up-detection signal DET_UP and a down-detection signal DET_DN based on the phase/frequency difference between the positive reference clock signal CLK_REF and a feedback clock signal CLK_FED from the voltage controlled oscillator 338. The up-detection signal DET_UP and the down-detection signal DET_DN are pulse signals which are activated according to the phase/frequency relationship between the positive reference clock signal CLK_REF and the feedback clock signal CLK_FED.

The charge pumping unit 334 performs a positive charge pumping operation in response to the up-detection signal DET_UP and performs a negative charge pumping operation in response to the down-detection signal DET_DN. That is, the charge pumping unit 334 supplies charges to the control voltage signal generating unit 336 in response to the up-detection signal DET_UP and discharges the control voltage signal generating unit 336 in response to the down-detection signal DET_DN.

The control voltage signal generating unit 336 produces an oscillation control voltage signal V_CTR according to the charge supplied or discharged by the positive charge pumping operation and the negative charge pumping operation of the charge pumping unit 334, respectively. In other words, the voltage level of the oscillation control voltage signal V_CTR is dependent upon the charging and discharging operation of the charge pumping unit 334.

The voltage controlled oscillator 338 produces the feedback clock signal CLK_FED having a frequency which corresponds to the oscillation control voltage signal V_CTR. The phase/frequency detecting unit 332 repeatedly produces the up-detection signal DET_UP and the down-detection signal DET_DN, which correspond to a phase/frequency difference between the feedback clock signal CLK_FED and the positive reference clock signal CLK_REF.

For reference, the phase-locked loop 330 can further include a divider on a transmission path of the feedback clock signal CLK_FED. In this case, according to the division rate of the divider, the feedback clock signal CLK_FED has a frequency divided by $2^N$ (N is a positive integer), compared to the positive reference clock signal CLK_REF.

As mentioned above, the phase-locked loop 330 according to the invention has the same structure as the conventional PLL; however, the phase-locked loop 330 is different from the conventional PLL in the usage. In other words, the conventional phase-locked loop is provided to generate the internal clock signals, but the phase-locked loop 330 according to the invention is provided to generate the oscillation control voltage signal V_CTR based on the feedback clock signal CLK_FED.

The operation of the phase-locked loop 330 will be described blow briefly.

The phase/frequency detecting unit 332 produces the up-detection signal DET_UP and the down-detection signal DET_DN by detecting the phase/frequency difference between the reference clock signal CLK_REF and the feedback clock signal CLK_FED. The up-detection signal DET_UP is a pulse signal having a pulse width corresponding to the phase difference when the phase of the feedback clock signal CLK_FED lags behind that of the reference clock signal CLK_REF. The down-detection signal DET_DN is a pulse signal having a pulse width corresponding to the phase difference when the phase of the feedback clock signal CLK_FED leads that of the reference clock signal CLK_REF.

The charge pumping unit 334 charges or discharges the control voltage signal generating unit 336 through a charge pumping operation which is conducted by the up-detection signal DET_UP and the down-detection signal DET_DNP. Through the charging or discharging operation, the voltage level of the oscillation control voltage signal V_CTR generated by the control voltage signal generating unit 336 is varied. In other words, the voltage level of the oscillation control voltage signal V_CTR becomes higher in response to the up-detection signal DET_UP and becomes lower in response to the down-detection signal DET_DN.

The voltage controlled oscillator 338 produces the PLL clock signal CLK_PLL of low frequency according to the oscillation control voltage signal V_CTR of a high voltage level and also produces the PLL clock signal CLK_PLL of high frequency according to the oscillation control voltage signal V_CTR of a low voltage level. The relationship between the oscillation control voltage signal V_CTR and the PLL clock signal CLK_PLL can be changed by design architecture. That is, it is possible to produce the PLL clock signal CLK_PLL of a low frequency according to the oscillation control voltage signal V_CTR of a low voltage level or produce the PLL clock signal CLK_PLL of high frequency according to the oscillation control voltage signal V_CTR of a high voltage level.

Next, the phase/frequency detecting unit 332 detects again the phase/frequency difference between the reference clock signal CLK_REF and the feedback clock signal CLK_FED changed in frequency, thereby outputting up/down detection signals DET_UP and DET_DN.

Through the repeated detections, the phase-locked loop 330 outputs the feedback clock signal CLK_FED in synchronization with the positive reference clock signal CLK_REF. That is, the phase/frequency locking is achieved between the positive reference clock signal CLK_REF and the feedback clock signal CLK_FED.

The phase-locked loop 330 according to the invention provides the injection locking oscillator 310 with the oscillation control voltage signal V_CTR which is closely associated with the phase/frequency locking operation between the positive reference clock signal CLK_REF and the PLL clock signal CLK_PLL.

Meanwhile, similarly to the conventional phase-locked loop, the phase-locked loop 330 according to the invention can also generate the jitter peaking phenomenon and the pattern jitter. However, since the injection locking oscillator 310, which is described below in detail with reference to FIG. 4, prevents the pattern jitter of the oscillation control voltage signal V_CTR, the phase-locked loop 330 can be designed considering only the jitter peaking phenomenon. In other words, the control voltage generating unit 336 can be designed with a desired phase margin by controlling the resistance and capacitance values, while giving no consideration to the increase of the pattern jitter.

As shown in FIG. 3, the clock synchronization circuit according to the invention has an open-loop system made up of the injection locking oscillator 310 and the phase-locked loop 330. In general, the open-loop system can obtain the phase margin easily.

Figure 4:
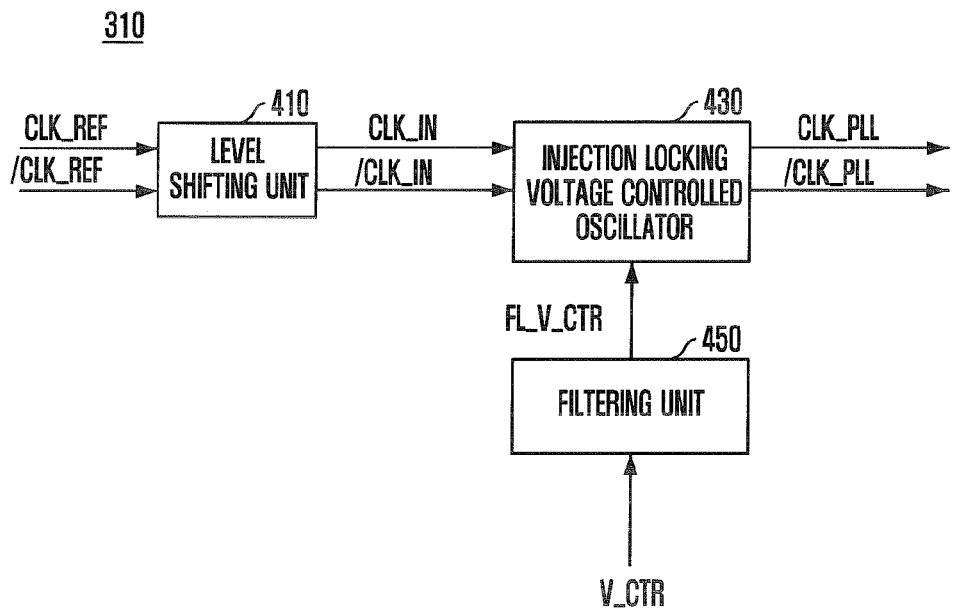
FIG. 4 is a block diagram illustrating an injection locking oscillator of FIG. 3.

FIG. 4 is a block diagram illustrating the injection locking oscillator 310 of FIG. 3. Referring to FIG. 4, the injection locking oscillator 310 includes a level shifting unit 410, an injection locking voltage controlled oscillator 430 and a filtering unit 450.

The level shifting unit 410 outputs positive/negative input clock signals CLK_IN and /CLK_IN swing in a CML (Current Mode Logic) level by shifting the positive/negative reference clock signals CLK_REF and /CLK_REF swinging in a CMOS (Complementary Metal Oxide Semiconductor) level. The level shifting unit 410 is provided in order to make the circuit operation fast and reduce power consumption. Here, the positive input clock signal CLK_IN is a clock signal corresponding to the positive reference clock signal CLK_REF and the negative input clock signal /CLK_IN is a clock signal corresponding to the negative reference clock signal /CLK_REF. The level shifting unit 410 is well known to those skilled in the art, and its detailed description therefore is omitted for the sake of brevity.

The injection locking voltage controlled oscillator 430 receives the positive/negative input clock signals CLK_IN and /CLK_IN and then generates the positive/negative PLL clock signals CLK_PLL and /CLK_PLL as the internal clock signals. At this time, the injection locking voltage controlled oscillator 430 sets up the free running frequency according to a filtered oscillation control voltage signal FL_V_CTR outputted from the filtering unit 450 and then generates the positive/negative PLL clock signals CLK_PLL and /CLK_PLL in synchronization with the positive/negative input clock signals CLK_IN and /CLK_IN. Here, the positive PLL clock signal CLK_PLL is a signal corresponding to the positive input clock signal CLK_IN and the negative PLL clock signal /CLK_PLL is a signal corresponding to the negative input clock signal /CLK_IN.

The injection locking voltage controlled oscillator 430 according to the invention uses the injection locking technique. In injection locking technique, an oscillation signal outputted from a master oscillator is injected into a slave oscillator and an oscillation signal outputted from the slave oscillator is synchronized with the oscillation signal outputted from the master oscillator. Typically, a circuit which is designed based on the injection locking technique can reduce power consumption and shows an improvement on the jitter. For reference, if the injection locking voltage controlled oscillator 430 to generate the positive/negative PLL clock signals CLK_PLL and /CLK_PLL functions as the slave oscillator, the level shifting unit 410 to generate the positive/negative input clock signals CLK_IN and /CLK_IN which are injected into the injection locking voltage controlled oscillator 430 functions as the master oscillator.

Accordingly, the injection locking voltage controlled oscillator 430 to adopt the injection locking technique produces the positive/negative PLL clock signals CLK_PLL and /CLK_PLL which are in synchronization with the positive/negative input clock signals CLK_IN and /CLK_IN. At this time, the synchronization between the positive/negative input clock signals CLK_IN and /CLK_IN and the positive/negative PLL clock signals CLK_PLL and /CLK_PLL is called "injection locking." Since this injection locking state is the same as a typical locking operation, its detailed description will be omitted for the sake of brevity.

In general, the injection locking voltage controlled oscillator 430 to adopt the injection locking technique is useful in reducing power consumption and improving the operating features on the jitter. However, the frequency of the oscillation signals injected for the injection locking, i.e., the positive/negative input clock signals CLK_IN and /CLK_IN, and the free running frequency of the slave oscillator (the injection locking voltage controlled oscillator 430), should be satisfied with a condition.

The relationship between these two frequencies will be described in detail.

First, to achieve the injection locking, i.e., to make the positive/negative input clock signals CLK_IN and /CLK_IN synchronized with the positive/negative PLL clock signals CLK_PLL and /CLK_PLL, the free running frequency of the injection locking voltage controlled oscillator 430 is to be positioned in the vicinity of the frequency of the positive/negative input clock signals CLK_IN and /CLK_IN. Otherwise, the injection locking is not created in the injection locking voltage controlled oscillator 430, such that the synchronization is not made between the positive/negative input clock signals CLK_IN and /CLK_IN and the positive/negative PLL clock signals CLK_PLL and /CLK_PLL. Since this is also a typical injection locking feature, a detailed description will be omitted for the sake of brevity.

Here, the frequency range of the positive/negative input clock signals CLK_IN and /CLK_IN by which the injection locking can be created is called the "injection locking range" and the injection locking range generally is a small range in the middle of the frequency of the positive/negative input clock signals CLK_IN and /CLK_IN. For convenience in illustration, the invention assumes that the injection locking range is one-tenth as much as the frequency of the positive/negative input clock signals CLK_IN and /CLK_IN.

For example, if the frequency of the positive/negative input clock signals CLK_IN and /CLK_IN is 4 GHz, the free running frequency of the injection locking voltage controlled oscillator 430 is to be positioned in the vicinity of 4 GHz. That is, since the injection locking range is one-tenth of 4 GHz, the frequency at which the injection locking can be created is to be positioned within 3.8 GHz to 4.2 GHz of the free running frequency of the injection locking voltage controlled oscillator 430. In other words, in order to carry out injection locking, the positive/negative input clock signals CLK_IN and /CLK_IN and the free running frequency of the injection locking voltage controlled oscillator 430 are to be positioned in a similar frequency range.

A circuit designer has to make the free running frequency of the injection locking voltage controlled oscillator 430 variable according to the frequency of the positive/negative input clock signals CLK_IN and /CLK_IN having a wide operation frequency range because the operation frequency range of the recent clock synchronization circuits becomes wider and wider.

In the invention, the oscillation control voltage signal V_CTR of the phase-locked loop of FIG. 3 is used in order that the frequency of the positive/negative input clock signals CLK_IN and /CLK_IN is positioned in the vicinity of the free running frequency of the injection locking voltage controlled oscillator 430. That is, the oscillation control voltage signal V_CTR makes the free running frequency of the injection locking voltage controlled oscillator 430 correspondent to the frequency of the positive/negative input clock signals CLK_IN and /CLK_IN. Therefore, the clock synchronization circuit according to the invention always satisfies the injection locking condition. As a result, it is possible to produce the positive/negative PLL clock signals CLK_PLL and /CLK_PLL synchronized with the positive/negative input clock signals CLK_IN and /CLK_IN.

On the other hand, the filtering unit 450 receives the oscillation control voltage signal V_CTR and then generates the filtered oscillation control voltage signal FL_V_CTR through the filtering operation. Since the phase-locked loop 330 is designed to secure a desired phase margin, the pattern jitter may be increased in the oscillation control voltage signal V_CTR. The filtering unit 450 performs the flirting operation of this increased pattern jitter and provides the filtered oscillation control voltage signal FL_V_CTR to the injection locking voltage controlled oscillator 430. Accordingly, the injection locking voltage controlled oscillator 430 produces the positive/negative PLL clock signals CLK_PLL and /CLK_PLL regardless of the pattern jitter of the oscillation control voltage signal V_CTR. The filtering unit 450 can be implemented by a low pass filter (LPF) which has a resistor to receive in series the oscillation control voltage signal V_CTR and a capacitor to be connected in parallel to the resistor. This configuration is well known to those skilled in the art to which the subject matter pertains, so the detailed description will be omitted for the sake of brevity.

Figure 5:
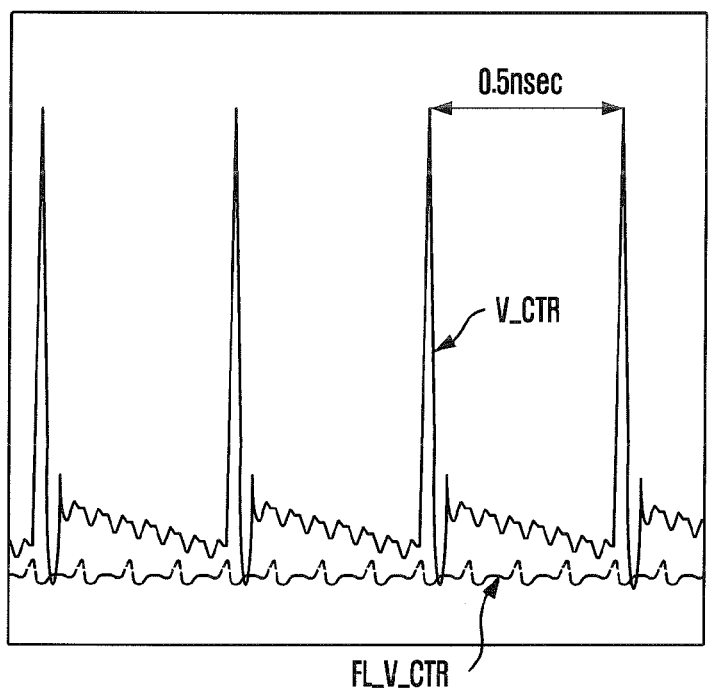
FIG. 5 is a waveform illustrating an oscillation control voltage signal and a filtered oscillation control voltage signal.

FIG. 5 is a waveform illustrating the oscillation control voltage signal V_CTR and the filtered oscillation control voltage signal FL_V_CTR. As shown in FIG. 5, there is the pattern jitter in the oscillation control voltage signal V_CTR generated in the phase-locked loop 330. However, the pattern jitter disappears in the filtered oscillation control voltage signal FL_V_CTR via the filtering unit 450. Therefore, the positive/negative PLL clock signals CLK_PLL and /CLK_PLL generated in the injection locking voltage controlled oscillator 430 are not influenced by the pattern jitter.

Figure 6:
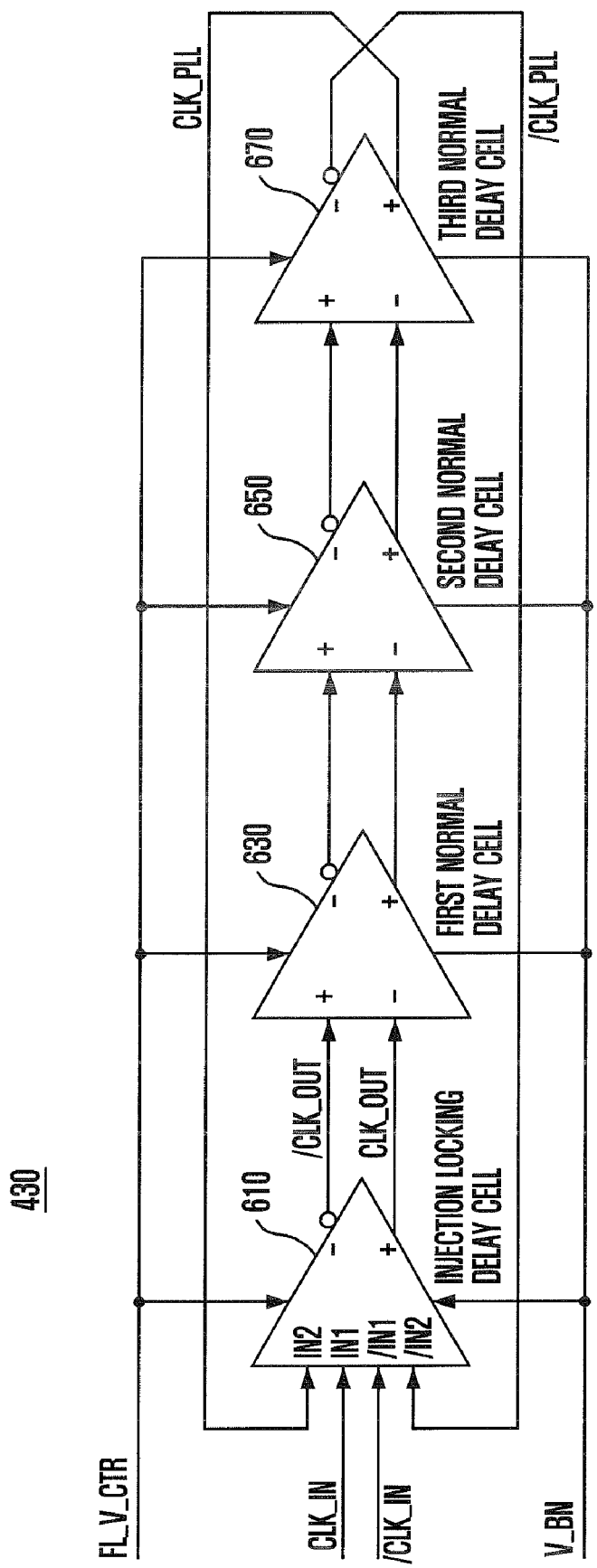
FIG. 6 is a circuit diagram illustrating an injection locking voltage controlled oscillator of FIG. 4.

FIG. 6 is a circuit diagram illustrating the injection locking voltage controlled oscillator 430 of FIG. 4. Referring to FIG. 6, the injection locking voltage controlled oscillator 430, which receives the filtered oscillation control voltage signal FL_V_CTR, produces the positive/negative PLL clock signals CLK_PLL and /CLK_PLL synchronized with the positive/negative input clock signals CLK_IN and /CLK_IN. The injection locking voltage controlled oscillator 430 can includes an injection locking delay cell 610 and first to third normal delay cells 630, 650 and 670. In the injection locking voltage controlled oscillator 430, the free running frequency is set up in response to the filtered oscillation control voltage signal FL_V_CTR and the injection locking operation is carried out based on the free running frequency. For example, when the voltage level of the filtered oscillation control voltage signal FL_V_CTR is high, the free running frequency is set up in a low frequency and, when the voltage level of the filtered oscillation control voltage signal FL_V_CTR is low, the free running frequency is set up in a high frequency. The relationship between the filtered oscillation control voltage signal FL_V_CTR and the free running frequency can be changed by a design requirement.

On the other hand, in order to produce positive/negative output clock signals CLK_OUT and /CLK_OUT which have the same frequency as the positive/negative input clock signals CLK_IN and /CLK_IN through the injection locking, the injection locking delay cell 610 receives the filtered oscillation control voltage signal FL_V_CTR. Further, the injection locking delay cell 610 receives the positive input clock signal CLK_IN via a first positive input terminal IN1, the negative input clock signal /CLK_IN via a first negative input terminal /IN1, the positive PLL clock signal CLK_PLL via a second positive input terminal IN2, and the negative PLL clock signal /CLK_PLL via a second negative input terminal /IN2.

The first normal delay cell 630 receives the filtered oscillation control voltage signal FL_V_CTR and receives output clock signals CLK_OUT and /CLK_OUT of the injection locking delay cell 610 via positive/negative input terminals (+ and −) of its own in order to delay the output clock signals CLK_OUT and /CLK_OUT of the injection locking delay cell 610 for a predetermined time corresponding to the filtered oscillation control voltage signal FL_V_CTR.

The second normal delay cell 650 receives the filtered oscillation control voltage signal FL_V_CTR and receives output clock signals of the first normal delay cell 630 via positive/negative input terminals (+, −) of its own in order to delay the output clock signals of the first normal delay cell 630 for a predetermined time corresponding to the filtered oscillation control voltage signal FL_V_CTR.

Also, the third normal delay cell 670 receives the filtered oscillation control voltage signal FL_V_CTR and receives output clock signals of the second normal delay cell 650 via positive/negative input terminals (+, −) of its own in order to delay the output clock signals of the second normal delay cell 650 for a predetermined time corresponding to the filtered oscillation control voltage signal FL_V_CTR. The third normal delay cell 670 generates the positive/negative PLL clock signals CLK_PLL and /CLK_PLL.

A bias voltage for controlling the injection locking delay cell 610 and the first to third normal delay cells 630, 650 and 670 is a reference voltage having a constant voltage level and this voltage can be generated by a bandgap circuit or a Widlar generator.

The first to third normal delay cells 630, 650 and 670 are provided in order to generate multiphase clock signals. In the invention, only one normal delay cell, which generate the positive/negative PLL clock signals CLK_PLL and /CLK_PLL through an oscillation operation with the injection locking delay cell 610, can be used. For reference, the multiphase clock signals are clock signal with a predetermined phase difference each other. For example, a plurality of clock signals outputted from the injection locking voltage controlled oscillator 430 (more specifically, from each of delay cells) can be 45° out of phase with each other. The multiphase clock signals provide various operation timing and reduce power consumption.

Figure 7:
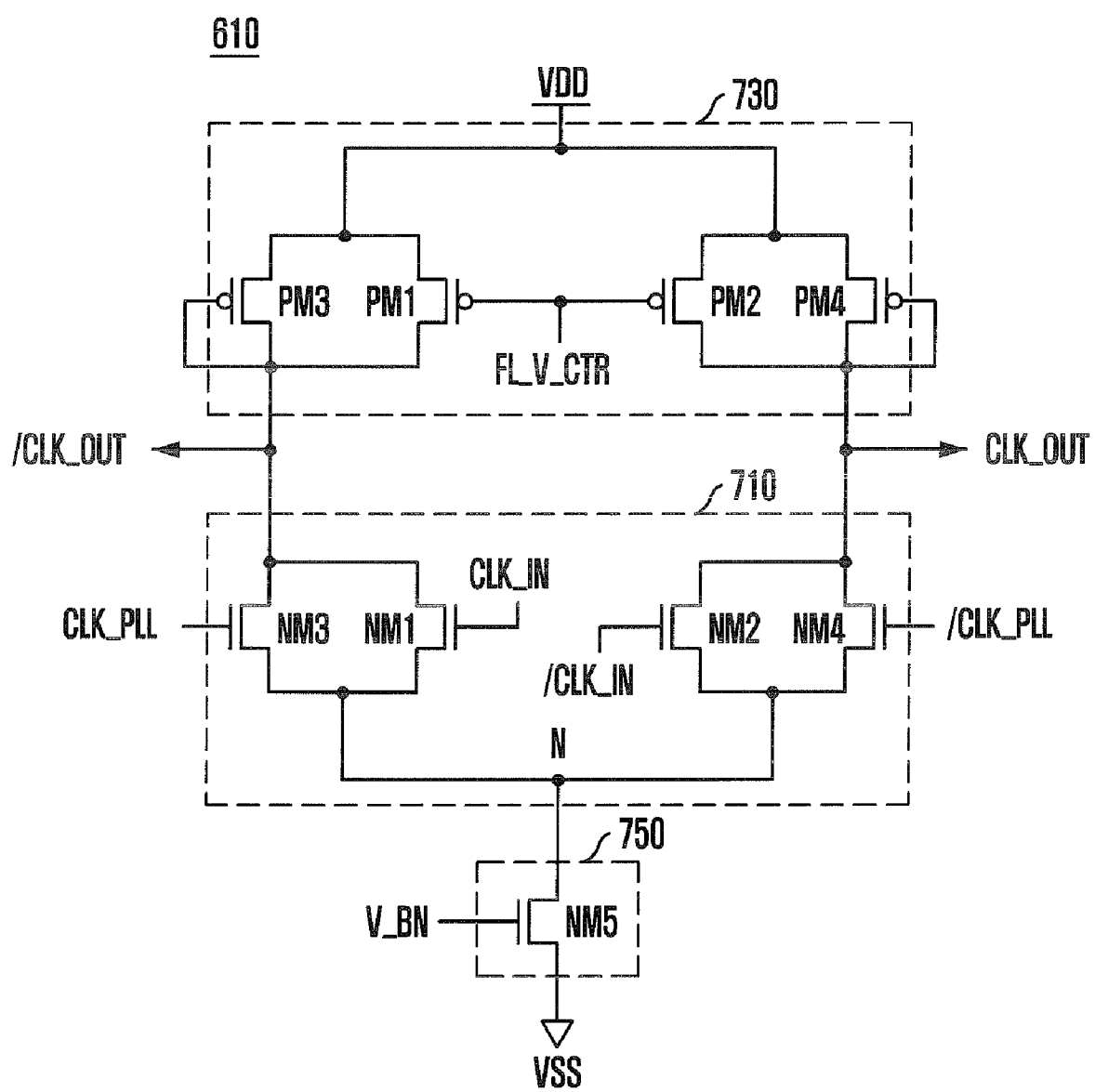
FIG. 7 is a circuit diagram illustrating an injection locking delay cell of FIG. 6.

FIG. 7 is a circuit diagram illustrating the injection locking delay cell 610 of FIG. 6.

Referring to FIGS. 6 and 7, the injection locking delay cell 610 includes an input/output unit 710, a loading unit 730 and a biasing unit 750.

The input/output unit 710 receives the positive/negative input clock signals CLK_IN and /CLK_IN and the positive/negative PLL clock signals CLK_PLL and /CLK_PLL for outputting the positive/negative output clock signals CLK_OUT and /CLK_OUT synchronized with the positive/negative input clock signals CLK_IN and /CLK_IN. The input/output unit 710 includes four NMOS transistors. A first NMOS transistor NM1 has a source-drain path between a common node N and an output terminal of the negative output clock signal /CLK_OUT and a gate to which the positive input clock signal CLK_IN inputted via the first positive input terminal IN1 (FIG. 6) is applied. A second NMOS transistor NM2 has a source-drain path between the common node N and an output terminal of the positive output clock signal CLK_OUT and a gate to which the negative input clock signal /CLK_IN inputted via the first negative input terminal /IN1 is applied. A third NMOS transistor NM3 has a source-drain path between the common node N and the output terminal of the negative output clock signal /CLK_OUT and a gate to which the positive PLL clock signal CLK_PLL inputted via the second positive input terminal IN2 is applied. The fourth NMOS transistor NM4 has a source-drain path between a common node N and the output terminal of the positive output clock signal CLK_OUT and a gate to which the negative PLL clock signal /CLK_PLL inputted via the second negative input terminal /IN2 is applied.

Similarly, the loading unit 730, which has a loading value corresponding to the filtered oscillation control voltage signal FL_V_CTR, includes four PMOS transistors. A first PMOS transistor PM1 has a source-drain path between the VDD power supply voltage terminal and the output terminal of the negative output clock signal /CLK_OUT and a gate to which the filtered oscillation control voltage signal FL_V_CTR is applied. A second PMOS transistor PM2 has a source-drain path between the VDD power supply voltage terminal and the output terminal of the positive output clock signal CLK_OUT and a gate to which the filtered oscillation control voltage signal FL_V_CTR is applied. Third and fourth PMOS transistors PM3 and PM4, which are in parallel connected to the first and second PMOS transistors PM1 and PM2, have gates to receive the positive/negative output clock signals CLK_OUT and /CLK_OUT, respectively.

Here, when the filtered oscillation control voltage signal FL_V_CTR is high, the loading value of the loading unit 730 is increased and, when the filtered oscillation control voltage signal FL_V_CTR is low, the loading value of the loading unit 730 is decreased. The relationship between the oscillation control voltage signal V_CTR and the loading value can be changed by a design requirement.

On the other hand, the biasing unit 750 makes operation current flow into the current pass of the injection locking delay cell 610 having the common node N in response to a bias voltage signal V_BN. The biasing unit 750 includes a fifth NMOS NM5 having a source-drain path between the common node N and a VSS ground voltage terminal and a gate to which the bias voltage signal V_BN is applied.

The injection locking delay cell 610 produces the positive/negative output clock signals CLK_OUT and /CLK_OUT which have the same frequency as the positive/negative input clock signals CLK_IN and /CLK_IN injected at the time of the injection locking. This injection locking operation is well known to those skilled in the art, so a detailed description will be omitted for the sake of brevity.

For reference, the injection locking range can be adjusted by changing the ratio of the size of the first NMOS transistor NM1 to the size of the third NMOS transistor NM3 and the ratio of the size of the second NMOS transistor NM2 to the size of the fourth NMOS transistor NM4.

Figure 8A:
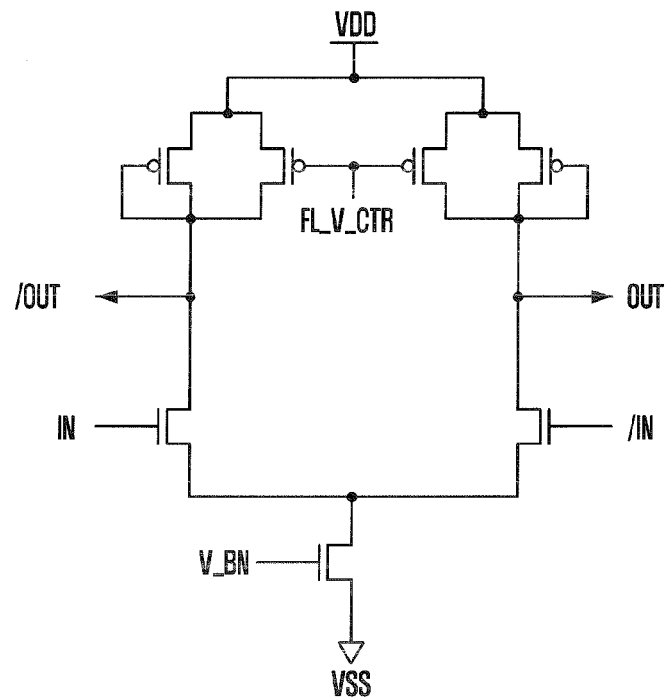
FIGS. 8A and 8B are circuit diagrams illustrating one of first to third normal delay cells.
Figure 8B:
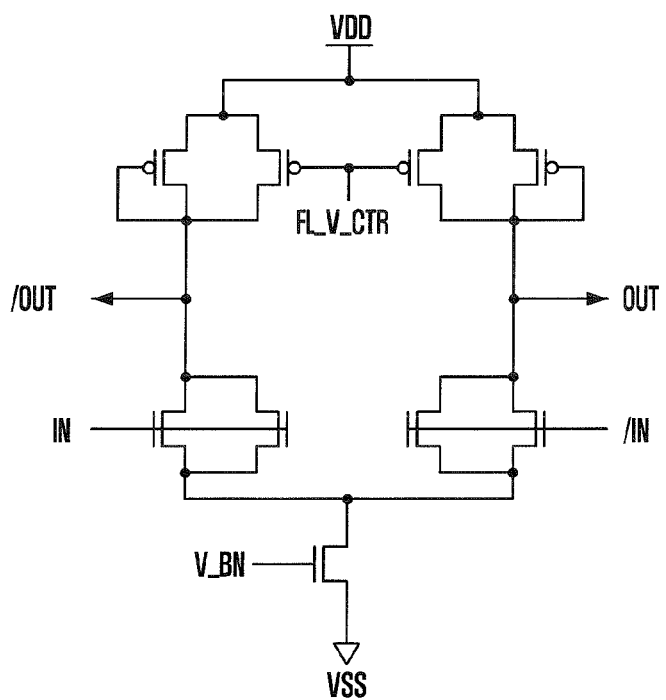

FIGS. 8A and 8B are circuit diagrams illustrating one of the first to third normal delay cells 630, 650 and 670. Referring to FIG. 8A, the normal delay cell is controlled by the filtered oscillation control voltage signal FL_V_CTR and produces output signals OUT and /OUT by receiving the clock signals from a front stage through input terminals IN and /IN and by delaying the inputted clock signals for a predetermined time. The frequency of the clock signals inputted from the input terminals IN and /IN is the same as the frequency of the output signals OUT and /OUT.

Referring to FIG. 8B, another normal delay cell is also controlled by the filtered oscillation control voltage signal FL_V_CTR and produces output signals OUT and /OUT by receiving the clock signals from a front stage through input terminals IN and /IN and by delaying the inputted clock signals for a predetermined time. The delay cells shown in FIGS. 8A and 8B conducts the same operation even if they has the different number of NMOS transistors to form the input terminals IN and /IN. However, it is preferred that the delay cell in FIG. 8B is used as the normal delay cells 630, 650 and 670 to operate symmetrically because the physical layout of the delay cell in FIG. 8B has the same structure as the injection locking delay cell 610.

Figure 9:
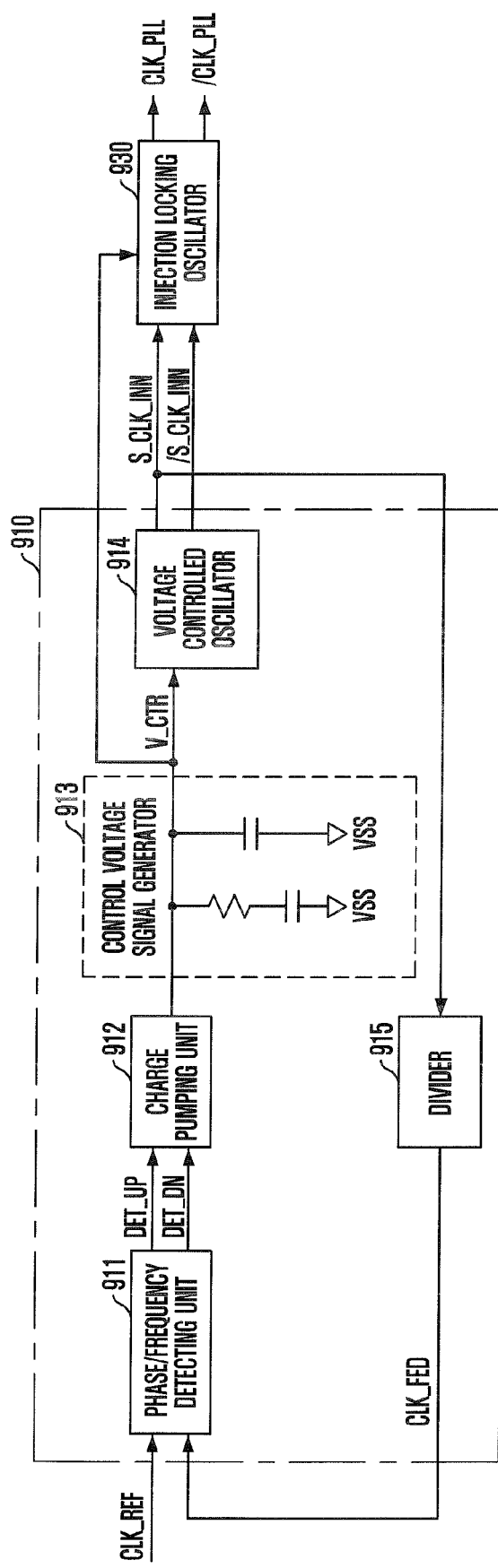
FIG. 9 is a block diagram illustrating a clock synchronization circuit according to another embodiment of the invention.

FIG. 9 is a block diagram illustrating a clock synchronization circuit according to another embodiment of the invention. Compared to an embodiment of FIG. 3, the clock synchronization circuit includes an injection locking oscillator 930 and a phase-locked loop 910 just connected to each other in different ways. However, it is similar to that of FIG. 3 in detailed structure and operation, and the description with respect to the detailed structure and operation will be omitted for the sake of brevity.

The phase-locked loop 910 has the structure of the phase-locked loop 330 described in FIG. 3 to provide an oscillation control voltage signal V_CTR, internal source clock signals S_CLK_INN and /S_CLK_INN to the injection locking oscillator 930. In the injection locking oscillator 930, a free running frequency is set up in response to the oscillation control voltage signal V_CTR and PLL clock signals CLK_PLL and /CLK_PLL are generated in synchronization with internal source clock signals S_CLK_INN and /S_CLK_INN. Herein, a positive internal source clock signal S_CLK_INN corresponds to a feedback clock signal CLK_FED. A negative internal source clock signal /S_CLK_INN is a complementary signal of the positive internal source clock signal S_CLK_INN.

Figure 10:
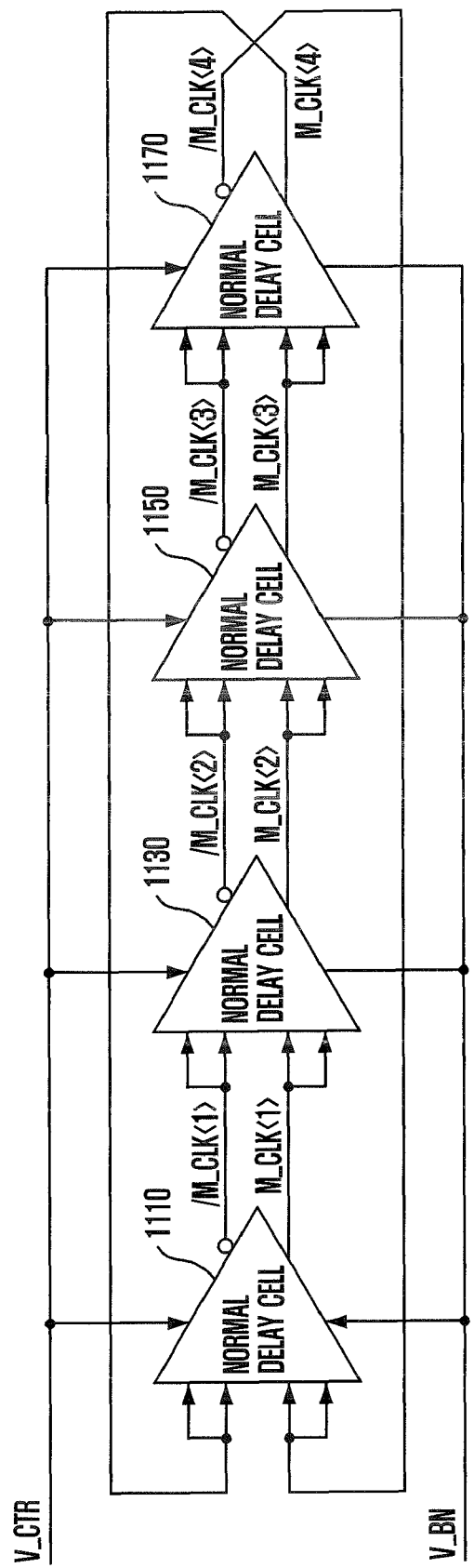
FIG. 10 is a circuit diagram illustrating a voltage controlled oscillator of FIG. 9.

Meanwhile, the injection locking oscillator 930 of FIG. 9 has the same structure as that of FIG. 4 and receives the positive/negative internal source clock signals S_CLK_INN and /S_CLK_INN as the positive/negative reference clock signals CLK_REF and /CLK_REF. However, the injection locking oscillator 930 can receive a plurality of signals as the internal source clock signals, not only the positive/negative signals. Accordingly, the injection locking voltage controlled oscillator of the injection locking oscillator 930 is implemented in accordance with another embodiment. In order to understand another embodiment, referring to FIG. 10, the voltage controlled oscillator 914 of FIG. 9 will be described in detail.

The voltage controlled oscillator 914 includes four normal delay cells 1110, 1120, 1150 and 1170. Generally, the normal delay cells 1110, 1120, 1150 and 1170 may have the structure described in FIG. 8A. However, the normal delay cells 1110, 1120, 1150 and 1170 have the structure described in FIG. 8B in order to be formed symmetrically to the injection locking voltage controlled oscillator in another embodiment of FIG. 11. At this time, it is desirable that the injection locking voltage-controlled oscillator also has the structure of the injection locking delay cells described in FIG. 7 for the symmetrical operation.

The voltage controlled oscillator 914 generates first to fourth positive/negative phase clock signals M_CLK<1> to /M_CLK<4>. The first to fourth negative phase clock signals /M_CLK<1>, /M_CLK<2>, /M_CLK<4> and /M_CLK<4> are inverted clock signals of the first to fourth positive phase clock signals M_CLK<1>, M_CLK<2>, M_CLK<3> and M_CLK<4>. The first to fourth positive phase clock signals M_CLK<1>, M_CLK<2>, M_CLK<3> and M_CLK<4> are multiphase clock signals having predetermined phase difference from each other, e.g., 45° C.

Figure 11:
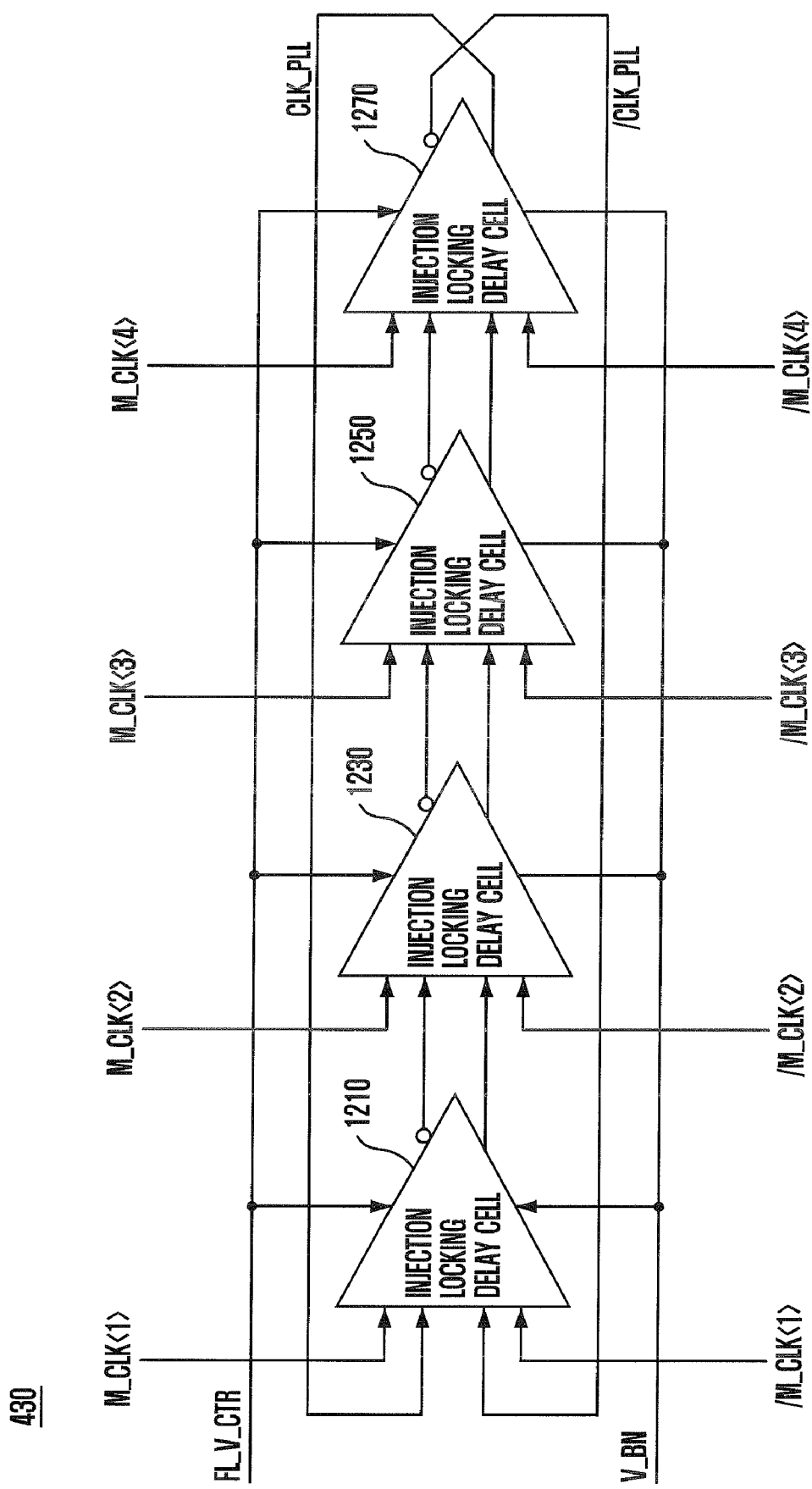
FIG. 11 is a circuit diagram illustrating the injection locking voltage controlled oscillator includes in an injection locking oscillator of FIG. 9 in accordance with another embodiment of the invention.

FIG. 11 is a circuit diagram illustrating the injection locking voltage controlled oscillator included in the injection locking oscillator 930 of FIG. 9 in accordance with another embodiment of the invention. Referring to FIG. 11, the injection locking voltage controlled oscillator can includes four injection locking delay cells 1210, 1230, 1250 and 1270 corresponding to the first to fourth positive/negative phase clock signals M_CLK<1> to /M_CLK<4>. The four injection locking delay cells 1210, 1230, 1250 and 1270 have the structure of the injection locking delay cells described in FIG. 7. Each injection locking delay cell receives the corresponding phase clock signals and perform the injection locking operation. The injection locking operation, which is described above, will not be illustrated again.

Although the phase clock signals, which of the number corresponds to the four injection locking delay cells 1210, 1230, 1250 and 1270, are used in an embodiment of FIG. 11, one clock signal may be used according to the embodiment if only the clock signal has a phase corresponding to that of the reference clock signals CLK_REF. That is, as described above, the internal source clock signals S_CLK_INN and /S_CLK_INN shown in FIG. 9, i.e., two clock signals of the first to fourth positive/negative phase clock signals M_CLK<1> to /M_CLK<4>, can be used as the phase clock signals.

FIG. 12 is graph showing the characteristics of the transfer function of the clock synchronization circuit of FIG. 9.

A Graph (a) illustrates the characteristics of the transfer function of the phase-locked loop 910. The jitter peaking phenomenon may appear around the bandwidth of the phase-locked loop 910. A Graph (b) illustrates the characteristics of the transfer function of the injection locking oscillator 930. It is desirable that the bandwidth of the phase-locked loop is greater than that of the injection locking oscillator for the stable operation.

A Graph (c) illustrates the characteristics of the transfer function of the clock synchronization circuit of FIG. 9, which is obtained by multiplying the transfer function of the phase-locked loop 910 (a) to that of the injection locking oscillator 930 (b). As shown in the Graph (c), the jitter peaking phenomenon appearing in the Graph (a) decreases incredibly. Herein, the phase-locked loop 910 may be designed by only taking a phase margin into consideration, and the pattern jitter generated thereby can be removed by the injection locking oscillator 930 by including a filtering unit. In addition, while phase-locked loop operation characteristics are secured by a general phase-locked loop, the jitter peaking phenomenon and the pattern jitter can be also removed through the injection locking oscillator.

Figure 13A:
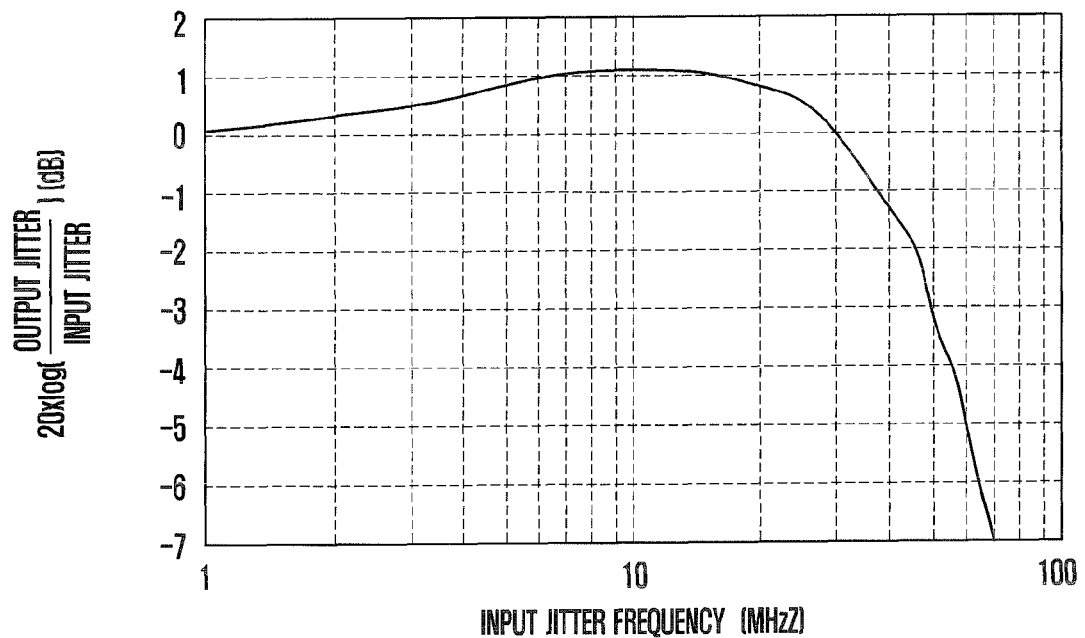
FIG. 13A is a graph showing the characteristics of the transfer function of the conventional clock synchronization circuit.
Figure 13B:
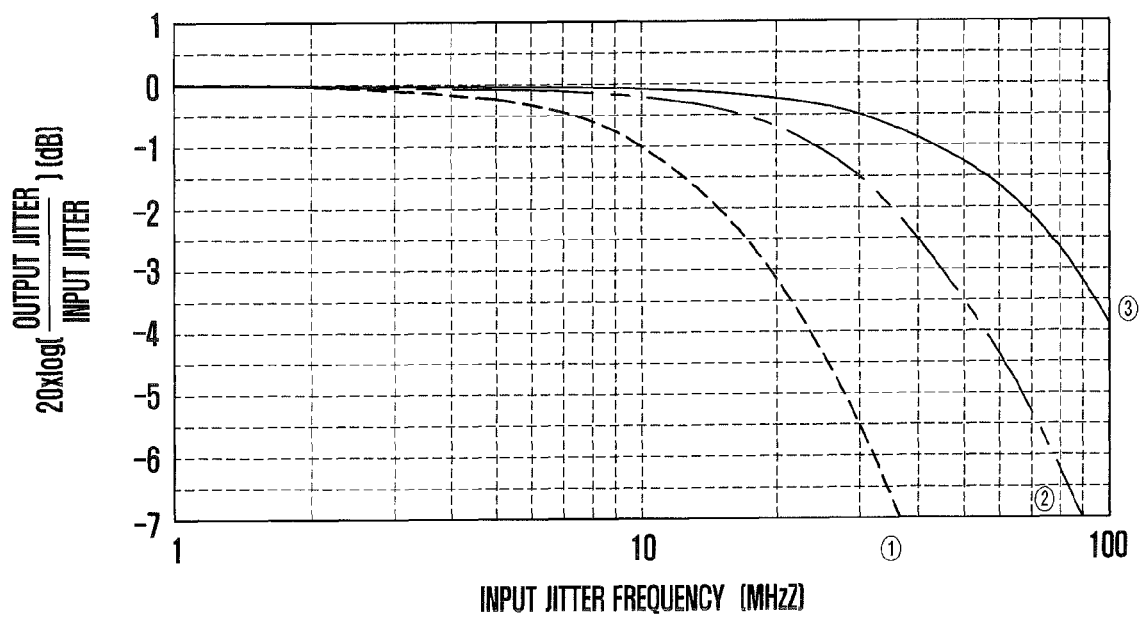
FIG. 13B is a graph showing the characteristics of the transfer function of the clock synchronization circuit according to the invention.

FIG. 13A is a graph showing the characteristics of the transfer function of the conventional phase-locked loop and FIG. 13B is a graph showing the characteristics of the transfer function of the phase-locked loop according to the invention.

Figure 1:
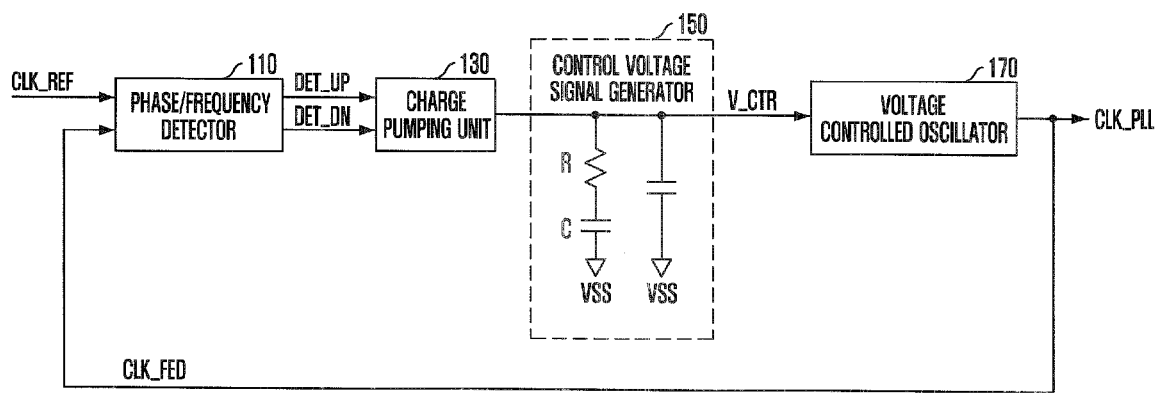
FIG. 1 is a block diagram illustrating a conventional analog phase-locked loop (PLL)
Figure 2:
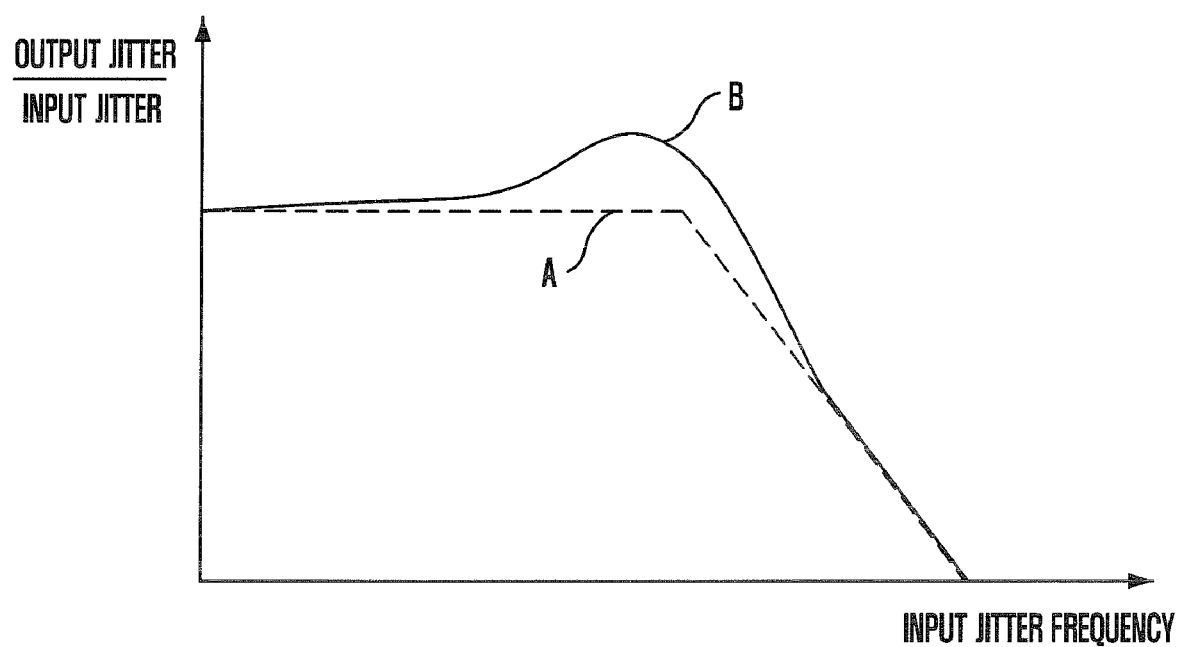
FIG. 2 is a graph showing characteristics of a jitter transfer function of the phase-locked loop of FIG. 1.

The jitter peaking phenomenon as shown in FIG. 2 also appears in FIG. 13A. However, the jitter peaking phenomenon is not shown in FIG. 13B at all with an ideal low pass filter feature. The reference numerals ①, ② and ③ in FIG. 13B denote characteristic graphs of the transfer function taken by the size control of the first to fourth NMOS transistors NM1 to NM4 of FIG. 7. There is not shown the jitter peaking phenomenon in the characteristic graphs of the transfer function.

As mentioned above, the clock synchronization circuit according to the invention can remove the jitter peaking phenomenon by forming the phase-locked loop and the injection locking oscillator. Further, since the injection locking oscillator uses the filtered oscillation control voltage signal FL_V_CTR, the pattern jitter of the oscillation control voltage signal V_CTR is not reflected in the PLL clock signals CLK_PLL and /CLK_PLL.

Further, the clock synchronization circuit according to the invention can reduce power consumption with stable phase/frequency locking operation.

The invention effective removes the jitter peaking phenomenon by providing the clock synchronization circuit through the open-loop system that uses the injection locking operation. In addition, the invention can perform the stable phase/frequency locking operation without the pattern jitter of a control voltage by using a filtered control voltage when the internal clock signals are generated.

Furthermore, the invention can improve performance of a phase-locked loop on the jitter with low-power consumption by using the injection locking operation.

While the invention has been described with respect to the particular embodiments, it will be apparent to those skilled in the art that various changes and modifications may be made without departing from the spirit and scope of the invention as defined in the following claims. For example, the transistor and the logic gates can be change in the positions or the types based on the polarity of the input and output signals.

What is claimed is:

1. A semiconductor memory device having a clock synchronization circuit, the clock synchronization circuit comprising:
   a phase-locked loop configured to detect a phase/frequency difference between a feedback clock signal and a reference clock signal to generate an oscillation control voltage signal corresponding to the detected phase/frequency difference, and generate the feedback clock signal corresponding to the oscillation control voltage; and
   an injection locking oscillation unit configured to set up a free running frequency in response to the oscillation control voltage signal and generate an internal clock signal which is synchronized with the reference clock signal.

2. The semiconductor memory device of claim 1, wherein the injection locking oscillation unit includes:
   a filtering unit configured to output a filtered control voltage signal by filtering the oscillation control voltage signal; and an injection locking voltage controlled oscillator configured to receive the filtered control voltage signal and generate the internal clock signal at a frequency corresponding to the reference clock signal.

3. The semiconductor memory device of claim 2, wherein the filtering unit includes a low pass filter.

4. The semiconductor memory device of claim 2, wherein the injection locking voltage controlled oscillator includes:
   an injection locking delay cell configured to receive the filtered control voltage signal, the reference clock signal and the internal clock signal and output an output clock signal corresponding to the reference clock signal; and
   a normal delay cell configured to generate the internal clock signal by delaying the output clock signals for a predetermined time according to the filtered control voltage signal.

5. The semiconductor memory device of claim 4, wherein the reference clock signal has the same frequency as the output clock signal.

6. The semiconductor memory device of claim 4, wherein the injection locking delay cell includes:
   an input/output unit configured to receive the reference clock signal and the internal clock signal and output the output clock signal in synchronization with the reference clock signal;
   a loading unit having a loading value corresponding to the filtered control voltage signal; and
   a biasing unit configured to provide an operation current to the injection locking delay cell in response to a bias voltage.

7. The semiconductor memory device of claim 6, wherein the input/output unit includes:
   a first input unit connected between differential output terminals and the biasing unit, configured to differentially receive the reference clock signal; and
   a second input unit connected between the differential output terminals and the biasing unit, configured to differentially receive the internal clock signal.

8. The semiconductor memory device of claim 1, further comprising a level shifting unit configured to shift a voltage level of the reference clock signal to a predetermined voltage level.

9. A clock synchronization circuit comprising:
   a phase/frequency detecting unit configured to detect a phase/frequency difference between a reference clock signal and a feedback clock signal and output a detection signal;
   a charge pumping unit configured to perform a charge pumping operation in response to the detection signal;
   a control voltage generating unit configured to generate an oscillation control voltage signal according to the charge pumping operation;
   a voltage controlled oscillator configured to generate the feedback clock signal according to the oscillation control voltage signal; and
   an injection locking oscillator configured to set up a free running frequency in response to the oscillation control voltage signal and generate an internal clock signal in synchronization with the reference clock signal.

10. The clock synchronization circuit of claim 9, further comprising:
   a first dividing unit configured to divide the feedback clock signal of the voltage controlled oscillator and provide the divided feedback clock signal to the phase/frequency detecting unit; and a second dividing unit configured to divide the reference clock signal and provide the divided reference clock signal to the phase/frequency detecting unit.

11. The clock synchronization circuit of claim 9, wherein the reference clock signal has the same frequency as the internal clock signal.

12. The clock synchronization circuit of claim 9, wherein the injection locking oscillator includes:
a filtering unit configured to output a filtered control voltage signal by filtering the oscillation control voltage signal; and
an injection locking voltage controlled oscillator configured to receive the filtered control voltage signal and generate the internal clock signal at a frequency corresponding to the reference clock signal.

13. The clock synchronization circuit of claim 12, wherein the filtering unit includes a low pass filter.

14. The clock synchronization circuit of claim 12, wherein the injection locking voltage controlled oscillator includes:
an injection locking delay cell configured to receive the filtered control voltage signal, the reference clock signal and the internal clock signal and output an output clock signal corresponding to the reference clock signal; and
a normal delay cell configured to generate the internal clock signal by delaying the output clock signals for a predetermined time according to the filtered control voltage signal.

15. The clock synchronization circuit of claim 14, wherein the reference clock signal has the same frequency as the output clock signal.

16. The clock synchronization circuit of claim 14, wherein the injection locking delay cell includes:
an input/output unit configured to receive the reference clock signal and the internal clock signal and output the output clock signal in synchronization with the reference clock signal;
a loading unit having a loading value corresponding to the filtered control voltage signal; and
a biasing unit configured to provide an operation current to the injection locking delay cell in response to a bias voltage.

17. The clock synchronization circuit of claim 16, wherein the input/output unit includes:
a first input unit connected between differential output terminals and the biasing unit, configured to differentially receive reference clock signal; and
a second input unit connected between the differential output terminals and the biasing unit, configured to differentially receive the internal clock signal.

18. The clock synchronization circuit of claim 9, further comprising a level shifting unit configured to shift a voltage level of the reference clock signal to a predetermined voltage level.

19. A method for driving a clock synchronization circuit, the method, comprising:
performing a phase/frequency locking operation between a reference clock signal and a feedback clock signal to generate an oscillation control voltage signal; and
setting up a free running frequency in response to the oscillation control voltage signal and performing an injection clocking operation to generate an internal clock signal in synchronization with the reference clock signal.

20. The method of claim 19, wherein the performing the phase/frequency locking operation includes:

outputting a phase/frequency difference between the reference clock signal and the feedback clock signal as a detection signal;
performing a charge pumping operation in response to the detection signal;
generating the oscillation control voltage signal according to the charge pumping operation; and
generating the feedback clock signal according to the oscillation control voltage signal.

21. The method of claim 19, further comprising dividing the reference clock signal; and
dividing the feedback clock signal.

22. The method of claim 19, wherein the performing the injection clocking operation includes:
performing a low pass filtering operation of the oscillation control voltage signal; and
generating the internal clock signal at a frequency corresponding to the reference clock signal in response to a filtered oscillation control voltage signal and.

23. The method of claim 22, wherein the generating the internal clock signal includes:
receiving the reference clock signal and a feedback signal of the internal clock signal to generate an output clock signal corresponding to the reference clock signal; and
generating the internal clock signal by delaying the output clock signal for a predetermined time corresponding to the filtered oscillation control voltage signal.

24. The method of claim 23, wherein the reference clock signal has the same frequency as the output clock signal.

25. The method of claim 19, wherein the reference clock signal has the same frequency as the internal clock signal.

26. A clock synchronization circuit, comprising:
a phase/frequency detecting unit configured to detect a phase/frequency difference between a reference clock signal and a feedback clock signal and output a detection signal;
a charge pumping unit configured to perform a charge pumping operation in response to the detection signal;
a control voltage generating unit configured to generate an oscillation control voltage signal according to the charge pumping operation;
a voltage controlled oscillator configured to generate internal source clock signals with a frequency corresponding to the oscillation control voltage signal;
a dividing unit configured to divide the internal source clock signals to output the feedback clock; and
an injection locking oscillator configured to set up a free running frequency in response to the oscillation control voltage signal and generate an internal clock signal in response to the internal source clock signals.

27. The clock synchronization circuit of claim 26, wherein the voltage controlled oscillator includes a plurality of delay cells configured to generate the internal source clock signals having a predetermined phase difference from each other.

28. The clock synchronization circuit of claim 27, wherein the injection locking oscillator includes:
a filtering unit configured to output a filtered control voltage signal by filtering the oscillation control voltage signal; and
an injection locking voltage controlled oscillator configured to receive the filtered control voltage signal and generate the internal clock signal in response to the internal source clock signals.

29. The clock synchronization circuit of claim 28, wherein the injection locking voltage controlled oscillator includes a plurality of injection locking delay cells configured to generate the internal clock signal in response to the internal source clock signals.

30. The clock synchronization circuit of claim 28, wherein the injection locking voltage controlled oscillator includes:
   a first injection locking delay cell configured to generate a pre internal clock signal in response to the filtered control voltage signal, one of the internal source clock signals and the internal clock signal; and
   a second injection locking delay cell configured to generate the internal clock signal in response to the filtered control voltage signal, the other of the internal source clock signals and the pre internal clock signal.

* * * * *